US011955349B2

(12) United States Patent
Yu et al.

(10) Patent No.: US 11,955,349 B2
(45) Date of Patent: Apr. 9, 2024

(54) ANISOTROPIC CARRIER FOR HIGH ASPECT RATIO FANOUT

(71) Applicant: Taiwan Semiconductor Manufacturing Co., Ltd., Hsinchu (TW)

(72) Inventors: Chen-Hua Yu, Hsinchu (TW); Chien Ling Hwang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/809,932

(22) Filed: Jun. 30, 2022

(65) Prior Publication Data
US 2022/0328327 A1 Oct. 13, 2022

Related U.S. Application Data

(63) Continuation of application No. 16/732,501, filed on Jan. 2, 2020, now Pat. No. 11,393,701.

(60) Provisional application No. 62/885,531, filed on Aug. 12, 2019.

(51) Int. Cl.
*H01L 21/56* (2006.01)
*H01L 21/683* (2006.01)
*H01L 23/00* (2006.01)

(52) U.S. Cl.
CPC .......... *H01L 21/568* (2013.01); *H01L 21/561* (2013.01); *H01L 21/6835* (2013.01); *H01L 24/03* (2013.01); *H01L 24/11* (2013.01); *H01L 2221/68359* (2013.01); *H01L 2224/02331* (2013.01); *H01L 2224/02379* (2013.01); *H01L 2224/02381* (2013.01); *H01L 2224/03002* (2013.01); *H01L 2224/11002* (2013.01)

(58) Field of Classification Search
None
See application file for complete search history.

(56) References Cited

U.S. PATENT DOCUMENTS

| | | | |
|---|---|---|---|
| 2016/0163650 A1* | 6/2016 | Gao | H01L 23/3128 438/126 |
| 2016/0351608 A1* | 12/2016 | Huang | H01L 27/14636 |
| 2017/0243763 A1 | 8/2017 | Choi et al. | |
| 2018/0138101 A1* | 5/2018 | Yu | H01L 23/481 |
| 2019/0088524 A1 | 3/2019 | Lee et al. | |
| 2021/0035949 A1 | 2/2021 | Huang | |

* cited by examiner

*Primary Examiner* — Jay C Chang
(74) *Attorney, Agent, or Firm* — Slater Matsil, LLP

(57) ABSTRACT

A method includes coating a release film over a carrier. The carrier includes a first material having a first Coefficient of Thermal Expansion (CTE), and a second material having a second CTE different from the first CTE. The method further includes placing a device die over the release film, encapsulating the device die in an encapsulant, and planarizing the encapsulant until the device die is revealed.

20 Claims, 16 Drawing Sheets

ANISOTROPIC CARRIER FOR HIGH ASPECT RATIO FANOUT

PRIORITY CLAIM AND CROSS-REFERENCE

This application is a continuation of U.S. patent application Ser. No. 16/732,501, entitled "Anisotropic Carrier for High Aspect Ratio Fanout," and filed Jan. 2, 2020, which claims the benefit of the U.S. Provisional Application No. 62/885,531, entitled "Anisotropic Carrier for High Aspect Ratio Fanout," and filed on Aug. 12, 2019, which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

In the formation of the fan-out packages, device dies are first placed on a carrier, and are molded in a molding compound. The molding compound is polished to expose the device dies. Redistribution lines are then formed over and fan-out from the metal pads of the device dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
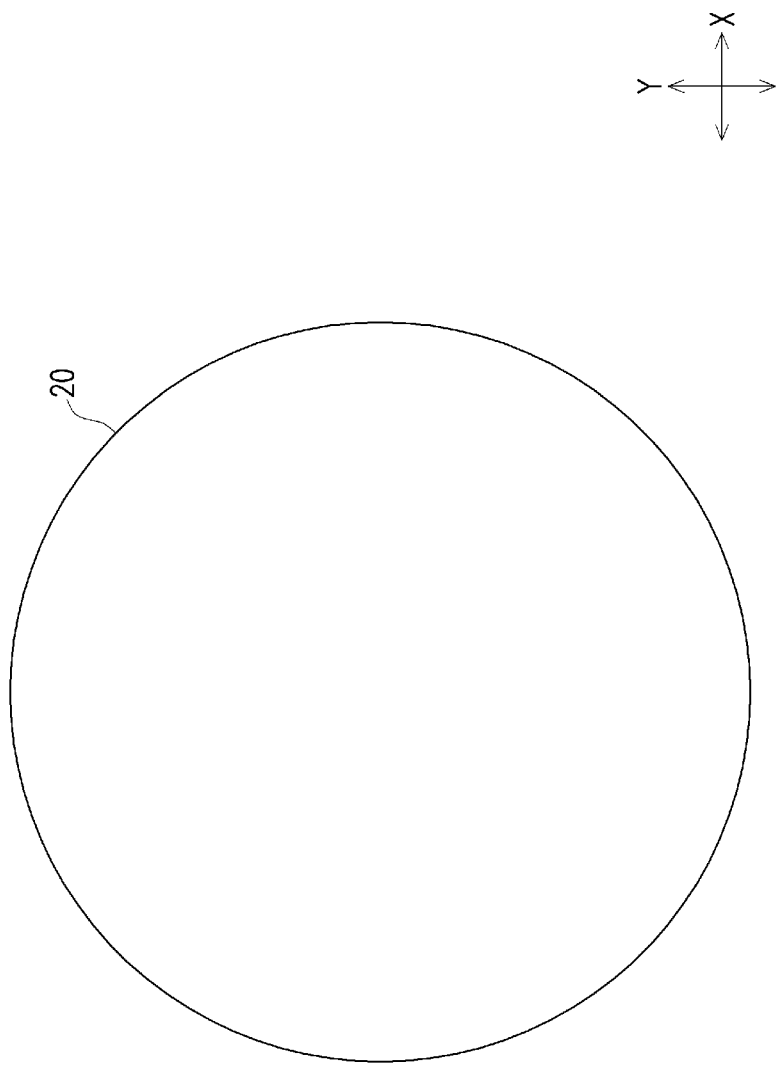
FIGS. 1, 2, 3A, 3B, and 4-7 illustrate the cross-sectional views and plane views of intermediate stages in the formation of an anisotropic carrier in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An anisotropic carrier and the method of forming the same are provided in accordance with some embodiments. The process of using the anisotropic carrier to form a fan-out package is discussed in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order. In accordance with some embodiments of the present disclosure, an anisotropic carrier, which has different Coefficients of Expansion (CTEs) in different directions of the major plane of the carrier, is formed. The formation process may include providing a carrier having a first CTE, forming elongated trenches (which may or may not be through-openings) in the carrier, and filling the trenches with a material having a second CTE different from the first CTE. Elongated device dies with high aspect ratios (the ratio of length to width) are placed over the carrier, and are encapsulated in an encapsulant. The different CTEs of the carrier in different directions may compensate for the warpage of the device die and the encapsulant to result in a reduced overall warpage. Also, the compensated warpage may have concentric round contour lines.

FIGS. 1, 2, 3A, 3B, and 4-7 illustrate the cross-sectional views and plane views of intermediate stages in the formation of an anisotropic carrier in accordance with some embodiments of the present disclosure. The corresponding processes are also reflected schematically in the process flow shown in FIG. 16.

Referring to FIG. 1, a plane view of carrier 20 is illustrated. In accordance with some embodiments of the present disclosure, carrier 20 has a round plane-view shape, with the diameter of the carrier being ranging, for example, from 8 inch to 30 inch or greater. Carrier 20 is formed of a transparent material such as glass, ceramic, an organic material, or the like. Carrier 20 has a top surface (shown in FIG. 2) parallel to a major plane of carrier 20. In accordance with some embodiments of the present disclosure, carrier 20 has a CTE (referred to as a first CTE hereinafter), which may be in the range between about 4 ppm/C° and about 12 ppm/C°. Furthermore, the material of the entire carrier 20 is homogeneous, with all parts of the carrier 20 being formed of the same material such as glass. Accordingly, carrier 20 has no distinguishable interface inside carrier 20. Carrier 20 is isotropic in CTEs, with the CTEs in all directions that parallel to the major plane being equal to the first CTE, wherein the all directions include the illustrated X-direction and Y-direction. Throughout the description of the present disclosure, the directions that are in (and parallel to) the major plane of carrier 20 are referred to as in-plane directions.

Figure 2:
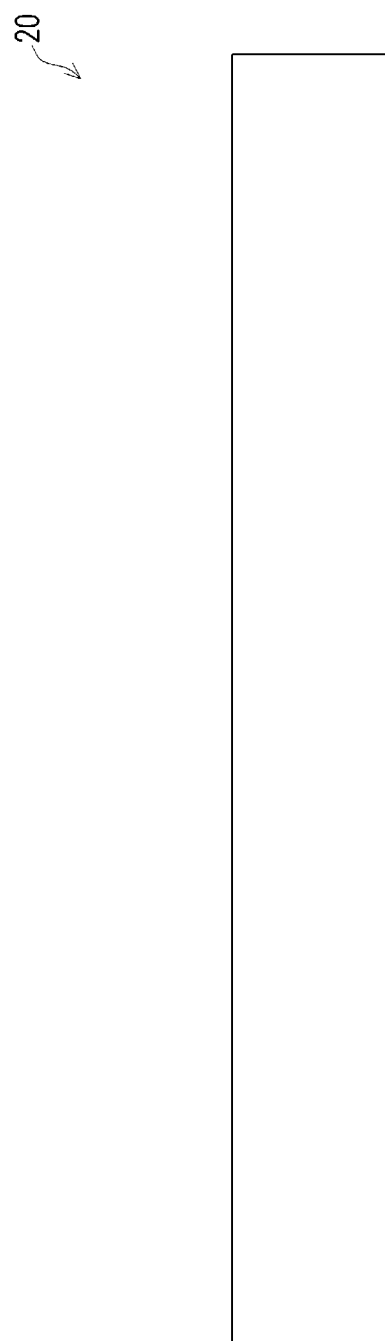

FIG. 2 illustrates a cross-sectional view of a portion of carrier 20 in accordance with some embodiments.

Figure 3A:
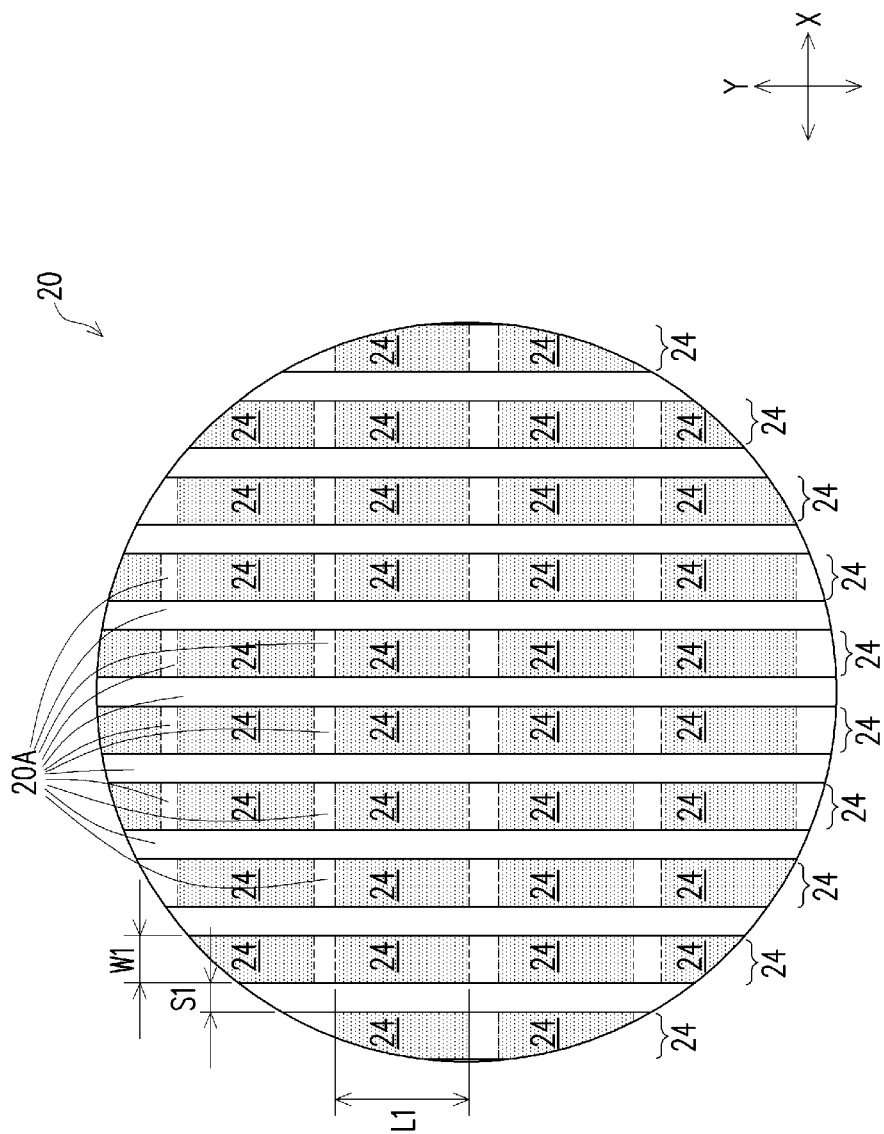
Figure 16:
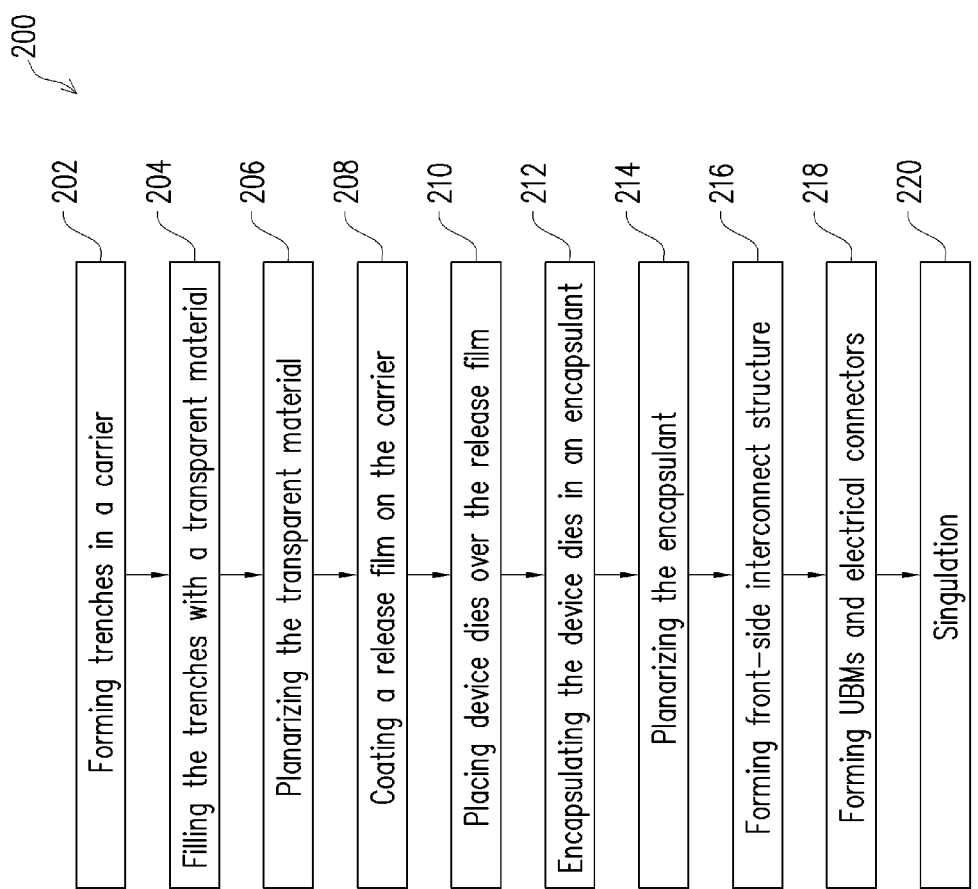
FIG. 16 illustrates a process flow for forming an anisotropic carrier and using the anisotropic carrier to form a package in accordance with some embodiments.

FIG. 3A illustrates a plane view of carrier 20 after the formation of trenches 24. In accordance with some embodiments of the present disclosure, a plurality of trenches 24 are formed to extend into carrier 20. The respective process is illustrated as process 202 in the process flow 200 as shown in FIG. 16. The formation of trenches 24 may be performed using etching, drilling, or the like. Trenches 24 may be elongated, with the lengthwise direction being in the Y-direction. In accordance with some embodiments of the present disclosure, some or all of trenches 24 extend from one end of carrier 20 to the opposite end. The elongated trenches 24 may be parallel to each other. In accordance with some embodiments, the elongated trenches 24 are equally spaced. In accordance with alternative embodiments, the spacings between neighboring trenches 24 are different from each other. In accordance with some embodiments, the elongated trenches 24 have a same width. In accordance with alternative embodiments, trenches 24 have different widths. The widths of trenches 24 are denoted as W1. The spacing between trenches 24 are denoted as S1. In accordance with some embodiments, ratio S1/W1 is in the range between about 0.1 and about 10.

Figure 3B:
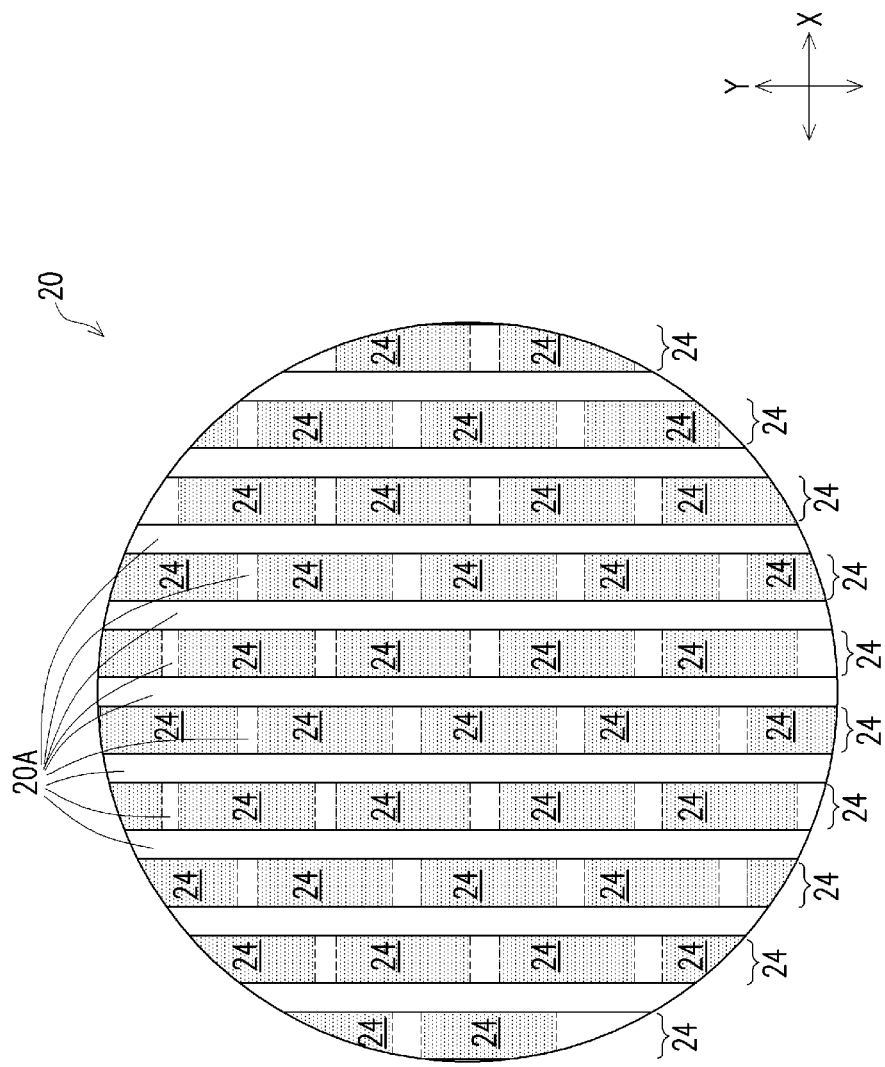

In accordance with some embodiments of the present disclosure, trenches 24, instead of continuously extending from one side of carrier 20 to the opposing side, may be discontinuous. A plurality of trenches 24 (as marked by dashed lines) are in a same column and are separated from each other. The dashed lines indicate that trenches 24 may or may not continuously extend from one edge to the opposing edge of carrier 20. As shown in in FIG. 3A, the separated trenches 24 may have rectangular plane-view shapes, with length L1 being greater than width W1. The aspect ratio L1/W1 may be greater than about 1.2 or greater than about 1.5, and may be in the range between about 1.5 and about 10 in accordance with some embodiments. Trenches 24 are separated from each other by carrier portions 20A (also refer to FIG. 4). Trenches 24 may be arranged as an array including a plurality of rows and a plurality of column. Trenches 24 may also be arranged with other patterns. For example, FIG. 3B illustrates that a column of trenches 24 may be shifted in the Y-direction relative to its neighboring column of trenches 24 on the left and its neighboring column trench 24 on the right.

Figure 4:
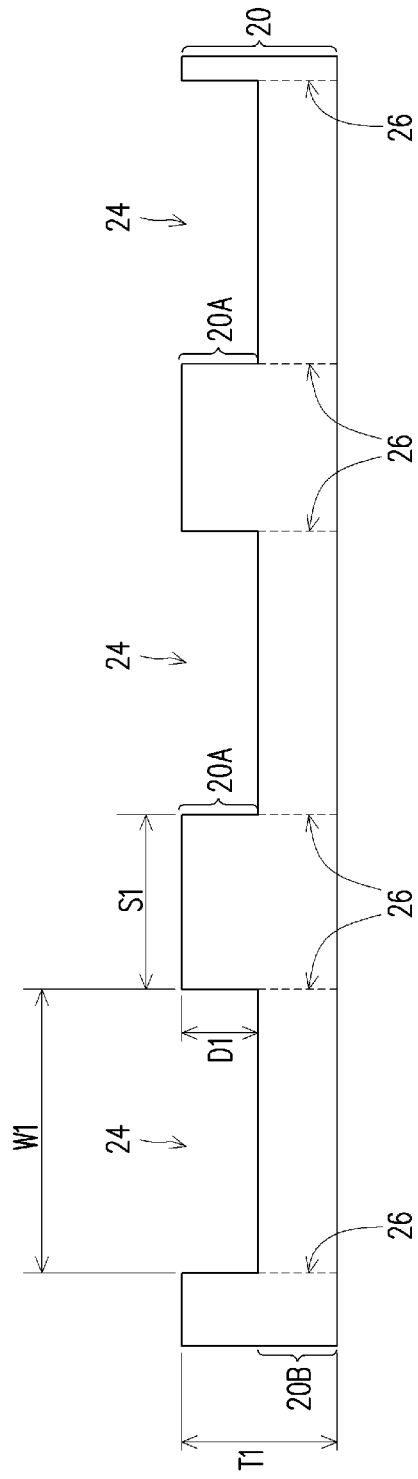

FIG. 4 illustrates a cross-sectional view of a portion of carrier 20 in accordance with some embodiments. Trenches 24 are formed to extend from the top surface of carrier 20 into carrier 20. In accordance with some embodiments of the present disclosure, trenches 24 extend to an intermediate level of carrier 20, with the intermediate level being between the top surface and the bottom surface of carrier 20. Depth D1 of trenches 24 is preferably not too small. Otherwise, its function of adjusting CTEs is compromised, as will be discussed in subsequent paragraphs. In accordance with some embodiments of the present disclosure, depth D1 is smaller than thickness T1, with the ratio D1/T1 being greater than 0.3, for example. Ratio D1/T1 may also be in the range between about 0.3 and about 1.0. When ratio D1/T1 is smaller than 1.0, the carrier 20 includes remaining portions 20A between neighboring trenches 24, and portion 20B underlying portions 20A and trenches 24.

In accordance with other embodiments, trenches 24 are through-trenches penetrating through carrier 20, wherein dashed lines 26 illustrate the sidewalls of the remaining portions 20A of carrier 20. It is appreciated that when trenches 24 continuously extend to opposite edges of carrier 20, and when trenches 24 are through-trenches, portions 20A of carrier 20 actually become discrete portions and carrier 20 may no longer be parts of an integrated carrier. In accordance with some embodiments of the present disclosure, at the opposite ends (in the Y-direction), as shown in FIG. 3, some edge portions of carrier 20 may be left, so that the edge portions join portions 20A of carrier 20 together as an integrated carrier 20. In accordance with other embodiments, discrete portions 20A are generated.

Figure 5:
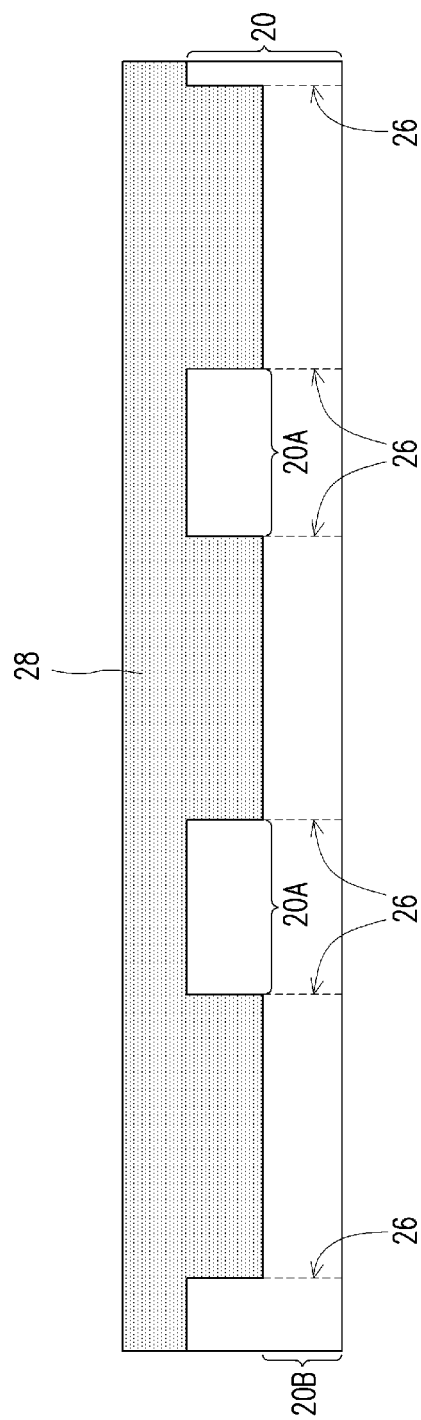

In a subsequent process, a second material 28 is filled into trenches 24, and the resulting structure is shown in FIG. 5. The respective process is illustrated as process 204 in the process flow 200 as shown in FIG. 16. In accordance with some embodiments of the present disclosure, the second material is a transparent material. The filling process may include melting the second material 28, dispensing the molten second material 28 into trenches 24, and allowing it to solidify. The filling process, depending on the second material 28, may also be performed using other processes such a deposition process.

The second material 28 has a second CTE different from the first CTE of carrier 20. In accordance with some embodiments of the present disclosure, the second CTE is in the range between about 6 ppm/C° and about 9 ppm/C°. The second material 28, after solidification, may also be isotropic and having the same second CTE in all in-plane directions. In accordance with some embodiments of the present disclosure, the CTE difference, which is equal to the absolute value of (CTE2−CTE1), is greater than about 0.5 ppm/C°, and may be in the range between about 1 ppm/C° and about 3 ppm/C°. The reason for having different CTEs is discussed in subsequent paragraphs.

Figure 6:
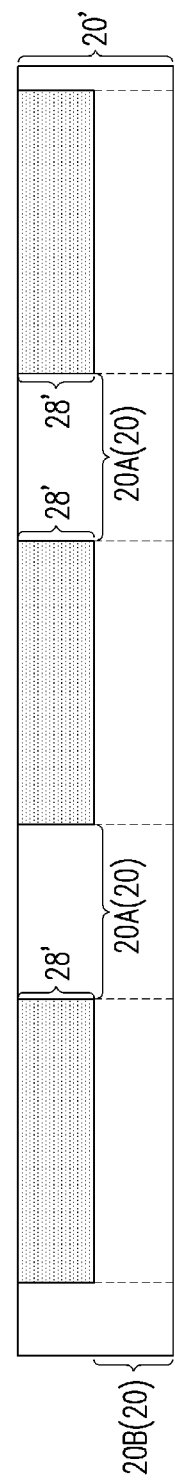
Figure 7:
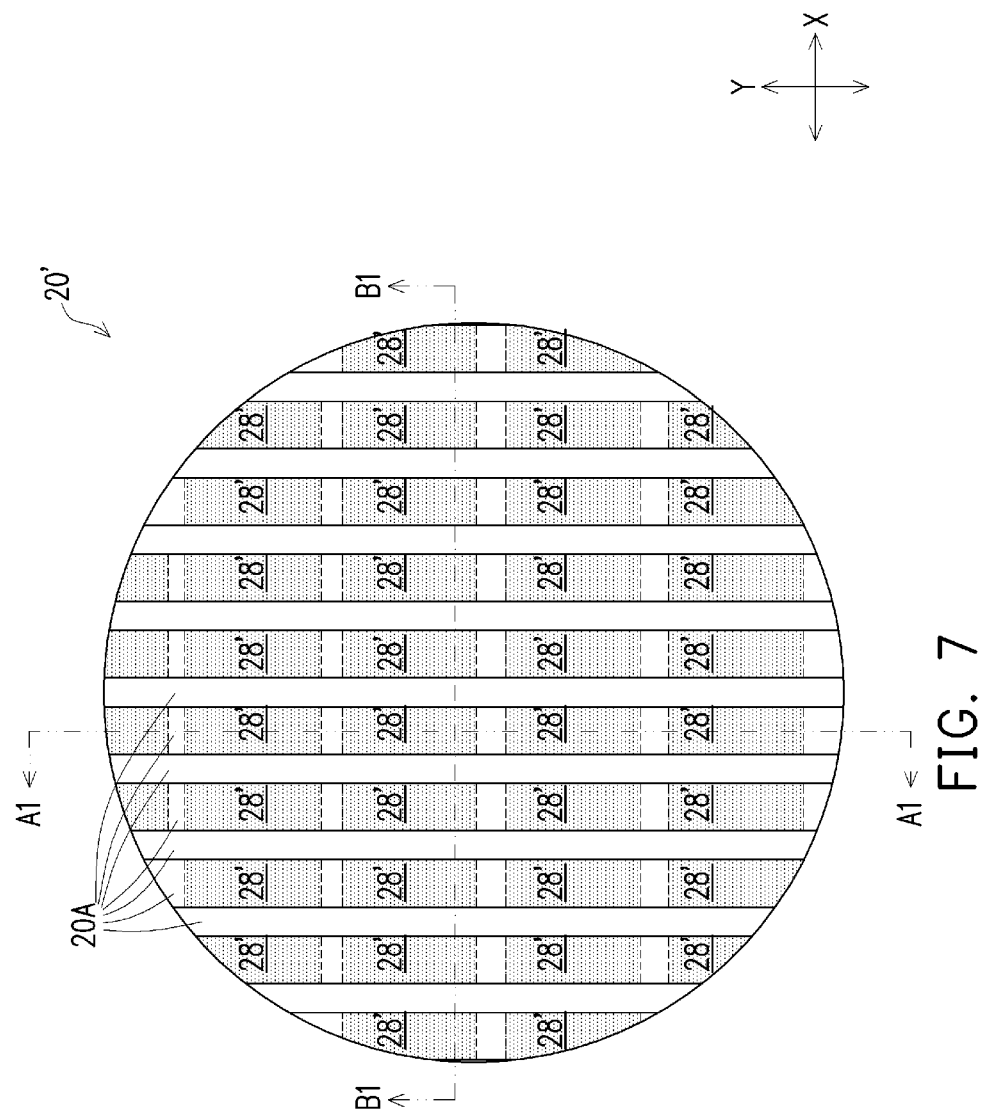

Referring to FIG. 6, a planarization process is performed to remove excess portions of the second material 28 over the top surface of portions 20A of the original carrier 20. The respective process is illustrated as process 206 in the process flow 200 as shown in FIG. 16. The remaining portions of the second material 28 are referred to as elongated strip portions 28' hereinafter. The remaining portions of carrier 20 and the elongated strip portions 28' in combination form composite carrier 20'. The top surfaces of portions 20A and the top surfaces of elongated strip portions 28' are coplanar. The plane-view shape of elongated strip portions 28' are shown in FIG. 7, which plane-view shape is essentially the same as the plane-view shape of trenches 24 as shown in FIG. 3A or 3B. Similar to what are discussed referring to FIGS. 3A and 3B, elongated strip portions 28' may extend to the opposing edges of carrier 20', or may include discrete portions that are aligned to a same column. Furthermore, elongated strip portions 28' may form a plurality rows and columns, as discussed referring to trenches 24.

In accordance with some embodiments in which carrier 20 is separated into discrete portions 20A, a mold may be used to fix the discrete portions 20A to have the same relative positions as when they are separated, with the spacings between the fixed discrete portions 20A being the same as in FIG. 4. Accordingly, after the second material 28 is dispensed into the spaces between the discrete portions 20A, the molten and solidified second material 28 join with the discrete portions 20A. After the planarization process, the integrated carrier 20' is formed, which may have the same shape and same size as carrier 20 (FIG. 1).

Figure 8:
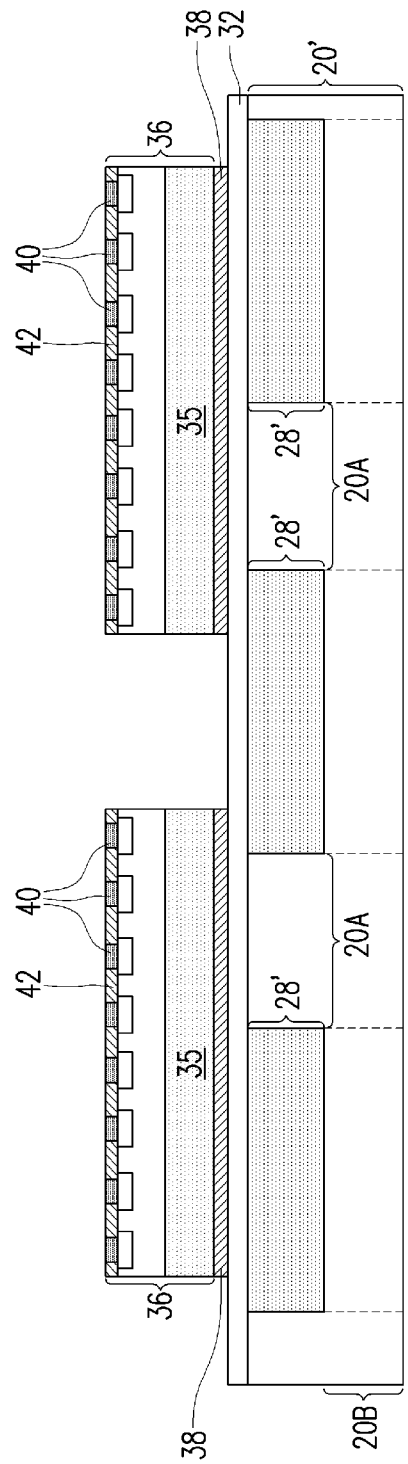
FIGS. 8 through 13 illustrate the cross-sectional views and plane views of intermediate stages in a packaging process using an anisotropic carrier in accordance with some embodiments.

FIGS. 8 through 13 illustrate the cross-sectional views and plane views of intermediate stages in the formation of a package in accordance with some embodiments of the present disclosure. Referring to FIG. 8, release film 32 is formed on carrier 20', for example, through coating. The respective process is illustrated as process 208 in the process flow 200 as shown in FIG. 16. Release film 32 may be in physical contact with the top surface of carrier 20'. Release film 32 may be formed of a Light-To-Heat-Conversion (LTHC) coating material. In accordance with some embodiments of the present disclosure, the LTHC coating material is capable of being decomposed under the heat of light/radiation (such as a laser beam), and hence can release carrier 20' from the structure formed thereon. In accordance with some embodiments of the present disclosure, release film 32 includes carbon black (carbon particles), a solvent, filler particles, and/or an epoxy. The epoxy may include polyimide or another polymer such as Acrylic.

Next, device dies 36 are placed on release film 32. The respective process is illustrated as process 210 in the process flow 200 as shown in FIG. 16. Device dies 36 are attached to release film 32 through Die-Attach Films (DAFs) 38, are adhesive films. In accordance with some embodiments of the present disclosure, DAFs 38 are pre-attached on device dies 36 before device dies 36 are placed on release film 32. Accordingly, a DAF 38 and a respective overlying device die 36, before being attached to release film 32, are in combination an integrated piece. Device dies 36 may include semiconductor substrates 35 having back surfaces (the surfaces facing down) in physical contact with DAFs 38. Semiconductor substrates 35 may be silicon substrates in accordance with some embodiments. Device dies 36 may include integrated circuit devices (such as active devices, which include transistors, for example, not shown) at the front surface (the surface facing up) of the semiconductor substrates 35. In accordance with some embodiments of the present disclosure, device dies 36 are logic dies, which may be Central Processing Unit (CPU) dies, Graphic Processing Unit (GPU) dies, mobile application dies, Micro Control Unit (MCU) dies, input-output (IO) dies, BaseBand (BB) dies, Application processor (AP) dies, or the like.

In accordance with some embodiments, metal pillars 40 (such as copper pillars) are pre-formed as portions of device dies 36, and metal pillars 40 are electrically coupled to the integrated circuit devices such as transistors (not shown) in device dies 36. In accordance with some embodiments of the present disclosure, a dielectric material such as a polymer fills the gaps between neighboring metal pillars 40 to form top dielectric layer 42. Top dielectric layer 42 may also include a portion covering and protecting metal pillars 40. Polymer layer 42 may be formed of PBO, polyimide, or the like.

Figure 11:
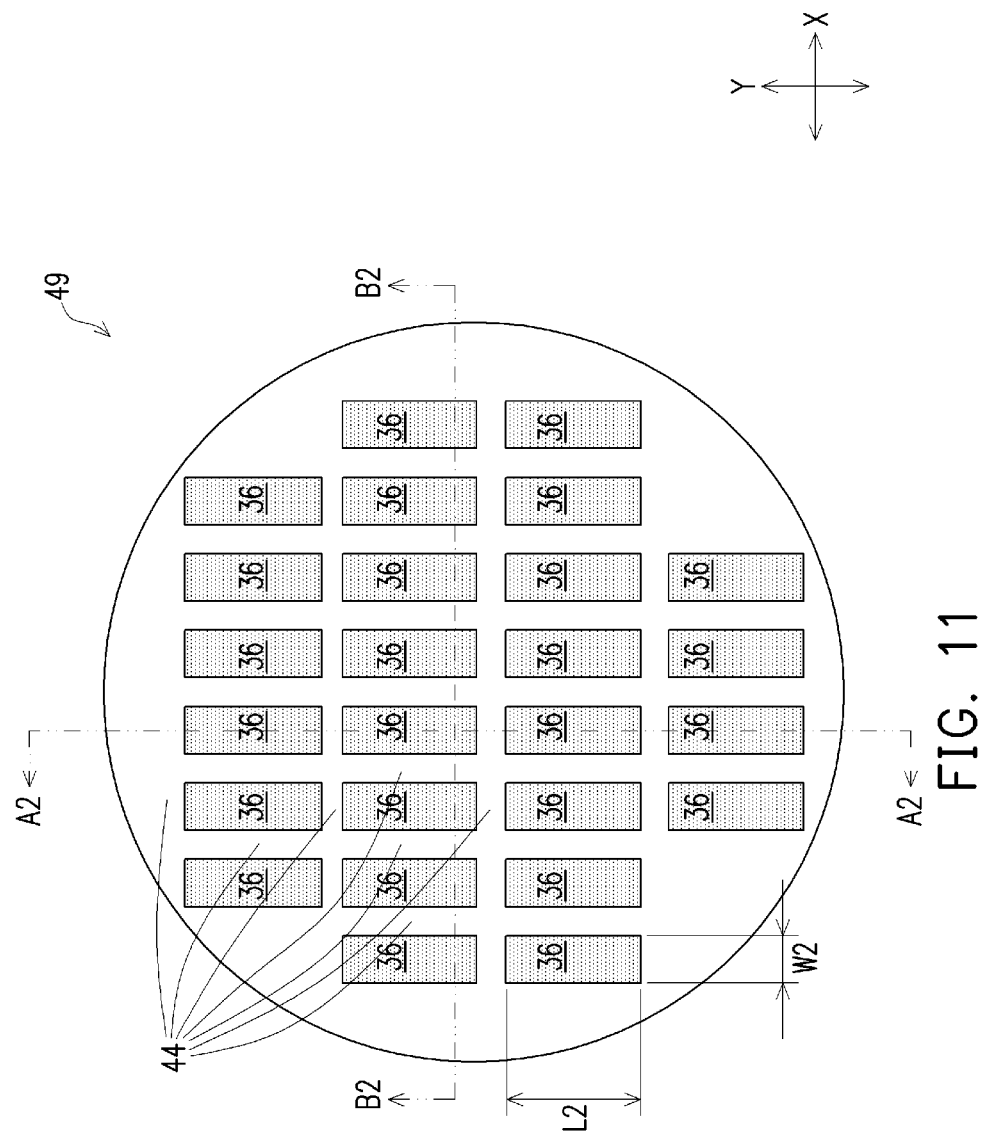

In accordance with some embodiments of the present disclosure, a plurality of device dies 36 are placed, which may be arranged as an array, as shown in FIG. 11. FIG. 11 illustrates a plane view of the plurality of device dies 36 in accordance with some embodiments. Device dies 36 may have elongated plane-view shapes, with lengths L2 being greater than widths W2. The aspect ratios L2/W2 of device dies 36 may be greater than about 1.2 or greater than about 1.5, and may be in the range between about 1.5 and 5.0, for example, and smaller or greater aspect ratios may be adopted. In accordance with some embodiments, both of device dies 36 and elongated strip portions 28' of carrier 20' are elongated. The lengthwise direction of device dies 36 may be parallel to the lengthwise direction of the elongated strip portions 28' of carrier 20', for example, both being in the Y-direction. In accordance with alternative embodiments, the lengthwise direction of device dies 36 is perpendicular to the lengthwise direction of the elongated strip portions 28' of carrier 20', for example, with one being in the X-direction, and the other in the Y-direction.

Figure 9:
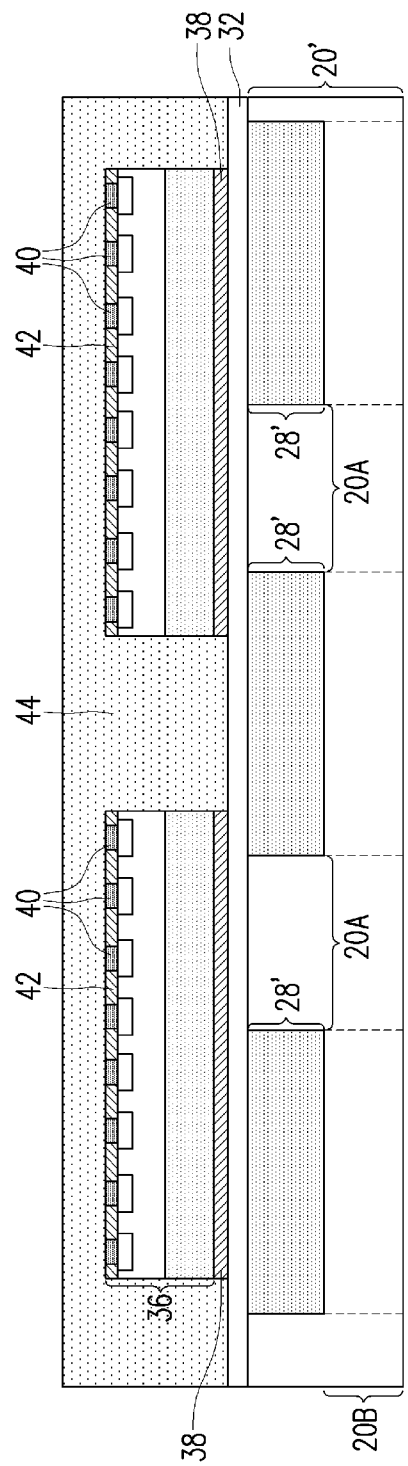

Referring to FIG. 9, an encapsulation process is performed to encapsulate device dies 36 in encapsulant 44, as shown in FIG. 9. The respective process is illustrated as process 212 in the process flow 200 as shown in FIG. 16. Encapsulant 44 fills the gaps between neighboring device dies 36. Encapsulant 44 may include a molding compound, a molding underfill, an epoxy, and/or a resin. The top surface of encapsulant 44 is higher than the top ends of metal pillars 40. Encapsulant 44 may include a base material, which may be a polymer, a resin, an epoxy, or the like, and filler particles in the base material. The filler particles, which may have spherical shapes, may be dielectric particles of $SiO_2$, $Al_2O_3$, silica, or the like. Also, the spherical filler particles may have a plurality of different diameters. Both the filler particles and the base material in encapsulant 44 may be in physical contact with the release film 32.

Figure 10:
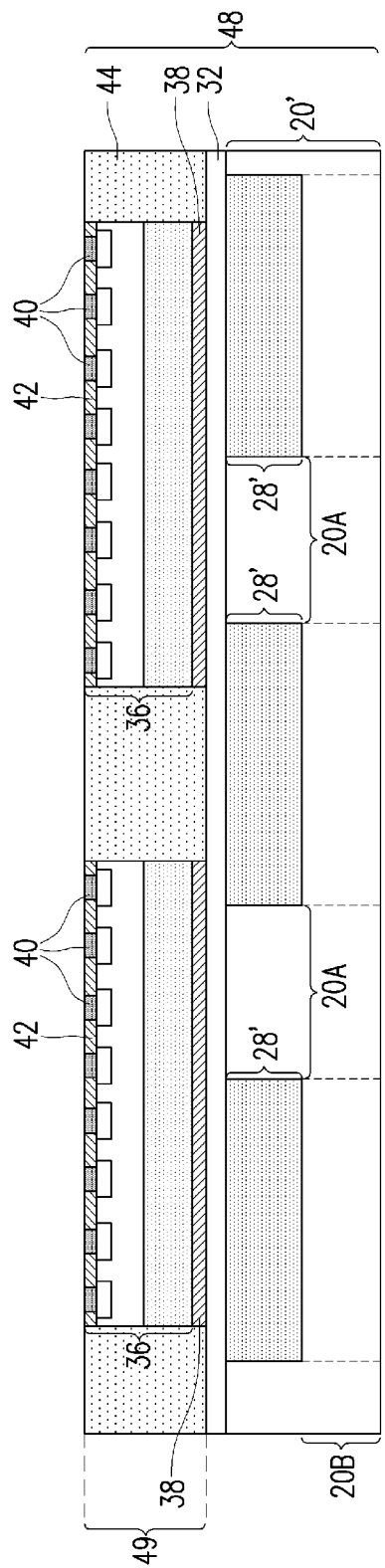

In a subsequent step, as shown in FIG. 10, a planarization process such as a Chemical Mechanical Polish (CMP) process or a mechanical grinding process is performed to thin encapsulant 44 and dielectric layer 42. As a result, metal pillars 40 are exposed. The respective process is illustrated as process 214 in the process flow 200 as shown in FIG. 16. Due to the planarization process, the top surface of encapsulant 44 is substantially level (coplanar) with the top surfaces of metal pillars 40. Throughout the description of the present disclosure, the structure including device dies 36 and encapsulant 44 is also referred to as composite structure 49. The structure shown in FIG. 10 is referred to as composite structure 48, which includes carrier 20', release film 32, and composite structure 49.

FIG. 11 illustrates a plane view of composite structure 49. The substrate (such as silicon substrate) in device dies 36, encapsulant 44, and carrier 20' have different CTEs. Among these three materials, silicon substrate may have the lowest CTE, encapsulant 44 may have the greatest CTE, and carrier 20' may have a CTE in between. For example, the silicon substrate in device dies 36 has a CTE close to about 3 ppm/C°. Encapsulant 44 has a higher CTE, for example, greater than about 10 ppm/C°, and may be in the range between about 11 ppm/C° and about 20 ppm/C°. Carrier 20', on the other hand, may have a CTE in the range between about 4 ppm/C° and about 12 ppm/C°.

Figure 15:
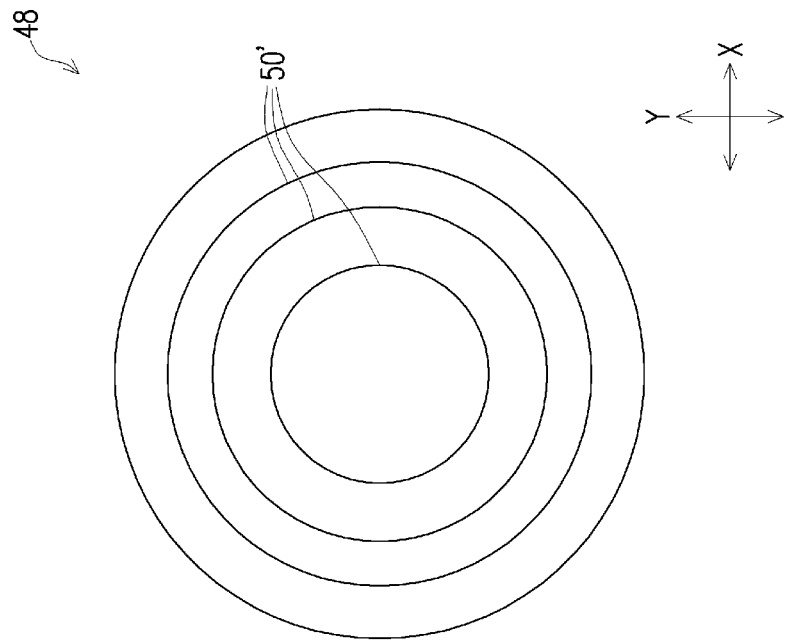
FIG. 15 schematically illustrates the warpage a package formed on an anisotropic carrier in a packaging process in accordance with some embodiments.
Figure 14:
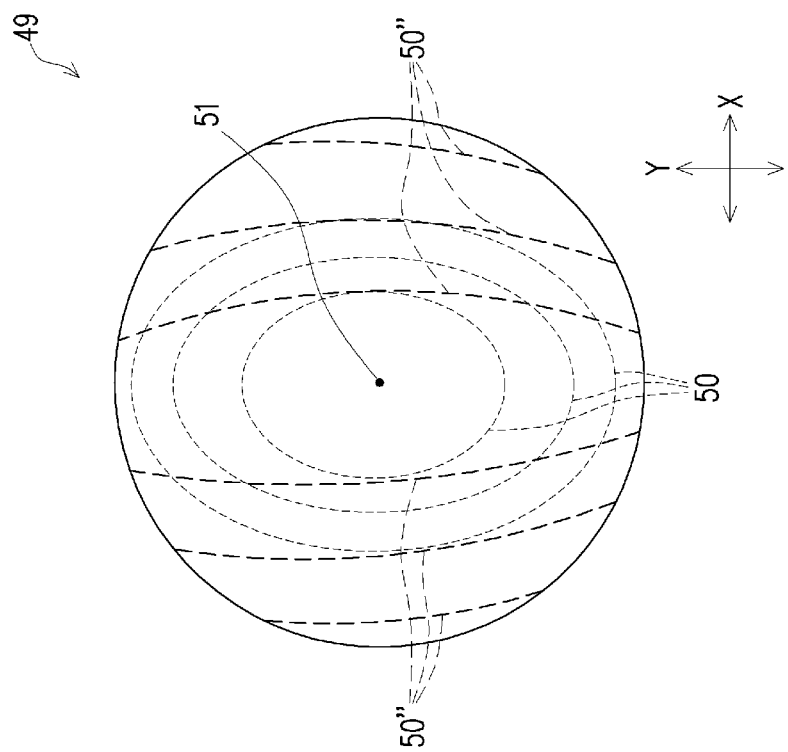
FIG. 14 schematically illustrates the warpage of a package formed on an isotropic carrier in a packaging process.

Experiment results indicated that the composite structure 49 (including device dies 36 and encapsulant 44) in FIG. 10 has non-uniform warpage. For example, FIG. 14 schematically illustrates the warpage of composite structure 49 in certain situations. Dashed lines 50 are the contour lines of the warpage. It may be considered that each line 50 shows a warpage level, and the points in the same contour line 50 have the same warpage level. It is observed that the warpage in the X-direction and Y-directions are not uniform. For example, a "warpage changing rate" between two points in a structure may be defined as (ΔWarp/Dis), wherein ΔWarp is the difference of the warpage levels of the two points, and Dis is the distance of the two points. It is observed that when starting from center 51 of composite structure 49, the warpage changing rate in the Y-direction is smaller than the warpage changing rate in the X-direction. The warpage shown in FIG. 14 are not round circles. It is difficult or impossible for production tools (such as the electro-static chuck or vacuum head) to handle the warpage as shown in FIG. 14, and production tools cannot pick up a composite structure if it has the warpage as shown in FIG. 14. On the other hand, the warpage with contour lines 50' as shown in FIG. 15 is easier for production tools to handle, and production tools may be able to pick up a composite structure if it has the warpage as shown in FIG. 15, in which warpage contour lines 50' are round and concentric. In accordance with some embodiments of the present disclosure, the warpage as shown in FIG. 14 is corrected using carrier 20' in accordance with the embodiments of the present disclosure, so that composite structure 48 are either planar or substantially planar, or have the warpage with contour lines 50' as shown in FIG. 15.

FIG. 11 illustrates two reference cross-sections A2-A2 and B2-B2, both crossing device dies 36. The reference cross-section A2-A2 crosses device dies 36 in the lengthwise direction of dies 36. The reference cross-section B2-B2 crosses device dies 36 in the widthwise direction of dies 36. It is shown that since device dies 36 are elongated, device dies 36 may occupy a higher percentage of composite structure 49 in the cross-section A2-A2 than in the cross-section B2-B2. Alternatively stated, there is a higher percentage of the relatively low-CTE device dies 36 in the reference cross-section A2-A2 than in the reference cross-section B2-B2, and there is a smaller percentage of the relatively high-CTE encapsulant 44 in the reference cross-section A2-A2 than in the reference cross-section B2-B2. Accordingly, if the CTE of the composite structure 49 in the Y-direction is denoted as CTE-Y, and the CTE of the composite structure 49 in the X-direction is denoted as CTE-X, CTE-X is greater than CTE-Y. The composite structure 49 thus has anisotropic CTEs.

Since CTE-X is greater than CTE-Y, the warpage level of composite structure 48 in the X-direction is higher than in the Y-direction. This results in the contour lines of warpage as shown in FIG. 14. If the difference between CTE-X and CTE-Y is further increased, the contour lines may even have the shape as shown by contour lines 50" in FIG. 14.

In accordance with some embodiments of the present disclosure, by inserting elongated strip portions 28' (FIG. 7), which are also elongated, carrier 20' also has anisotropic CTEs. This is caused by the fact that elongated strips 28' occupy a smaller percentage in the reference cross-section A1-A1 than in the reference cross-section B1-B. For example, referring to FIG. 7, when the lengthwise direction of device dies 36 are also in the Y-direction, and when elongated strip portions 28' have a CTE smaller than the CTE of the original material of carrier 20, the overall CTE CTE-X' (X-direction CTE) of carrier 20' is also greater than the overall CTE CTE-Y' (Y-direction CTE) of carrier 20'. This means that both of carrier 20' and the overlying composite structure 49 (FIG. 10) have their X-direction CTEs greater than their corresponding Y-direction CTEs. Accordingly, when the overlying composite structure 49 tries to bend in certain way against carrier 20', carrier 20' will also try to bend back against the composite structure 49. The warpage of composite structure 48 is thus reduced. Furthermore, the effect of the anisotropic CTEs of composite structure 48 is compensated for by carrier 20', which means that if composite structure 48 has a warpage, the contour lines of the warpage will be more close to the contour lines 50' in FIG. 15. It is thus possible for production tools to handle composite structure 48.

In accordance with alternative embodiments, when the elongated device dies 36 have their lengthwise in the Y-direction, elongated strip portions 28' in the underlying carrier 20' may have their lengthwise in the X-direction. In accordance with these embodiments, however, the CTE of the elongated strip portions 28' will be greater than the CTE of the original carrier 20 (such as the CTE of portions 20A and 20B in FIG. 10).

Figure 12:
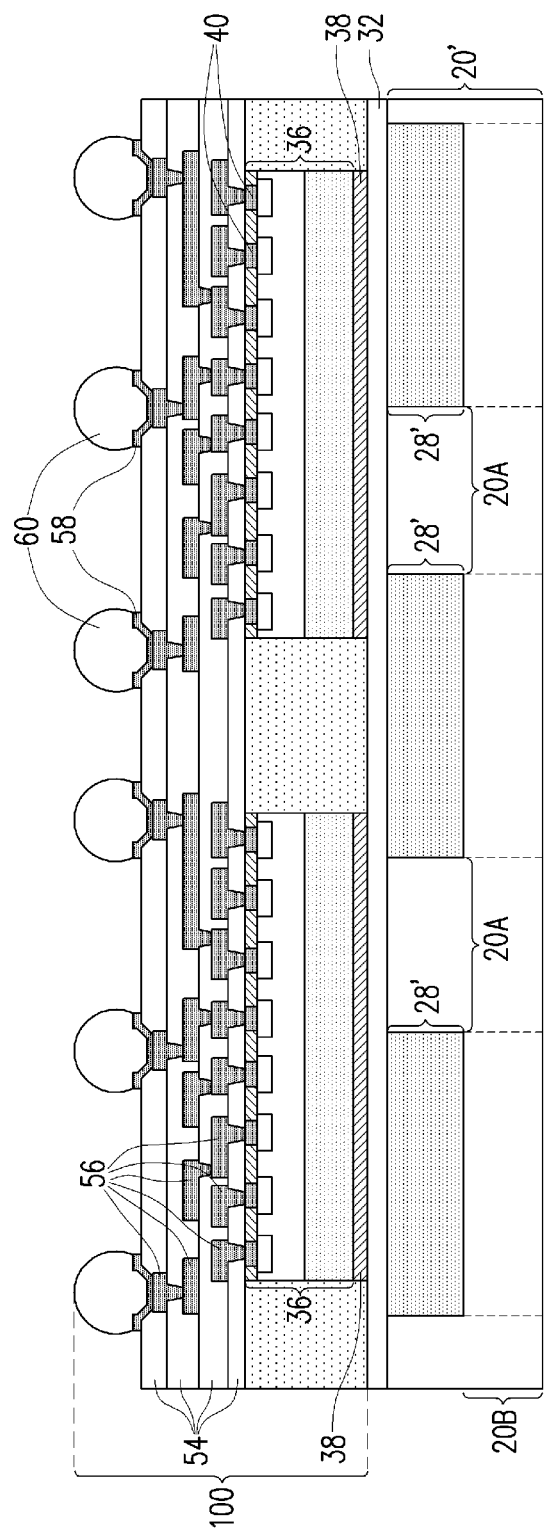

FIG. 12 illustrates the formation of a front-side redistribution structure, which includes a plurality of dielectric layers 54 and Redistribution Lines (RDLs) 56. The respective process is illustrated as process 216 in the process flow 200 as shown in FIG. 16. In accordance with some embodiments of the present disclosure, dielectric layers 54 are formed of polymers such as polybenzoxazole (PBO), polyimide, or the like. The formation of a dielectric layer 54 and the corresponding RDLs 56 (that extend into the dielectric layer 54) are used as an example to discuss the formation process as follows.

In accordance with some embodiments of the present disclosure, the formation process includes coating dielectric layer 54 in a flowable form, and then curing dielectric layer 54. Openings are then formed in the dielectric layer 54, for example, through a photo lithography process. In accordance with some embodiments in which dielectric layer 54 is formed of a photo sensitive material such as PBO or polyimide, the formation of the openings involves a photo exposure process using a lithography mask (not shown), followed by a development step. The conductive features underlying the dielectric layer 54, such as metal pillars 40 or RDLs 56 are exposed through the openings.

Next, RDLs 56 are formed, which include vias formed in dielectric layer 54 to contact the underlying conductive features, and metal traces (metal lines) over dielectric layer 54. In accordance with some embodiments of the present disclosure, RDLs 56 are formed in a plating process, which includes depositing a metal seed layer (not shown), forming and patterning a photo resist (not shown) over the metal seed layer, and plating a metallic material such as copper and/or aluminum over the metal seed layer. The metal seed layer and the plated metallic material may be formed of the same material or different materials. The patterned photo resist is then removed, followed by etching the portions of the metal seed layer previously covered by the patterned photo resist.

FIG. 12 further illustrates the formation of Under-Bump Metallurgies (UBMs) 58. The respective process is illustrated as process 218 in the process flow 200 as shown in FIG. 16. In accordance with some embodiment of the present disclosure, UBMs 58 are formed to extend into the openings in dielectric layer 54 to contact the metal pads in RDLs 56. UBMs 58 may be formed of nickel, copper, titanium, or multi-layers thereof. In accordance with some embodiments, UBMs 58 include a titanium layer and a copper layer over the titanium layer.

Electrical connectors 60 are then formed. The respective process is also illustrated as process 218 in the process flow 200 as shown in FIG. 16. The formation of electrical connectors 60 may include placing solder balls on the exposed portions of UBMs 58, and then reflowing the solder balls, and hence electrical connectors 60 are solder regions. In accordance with alternative embodiments of the present disclosure, the formation of electrical connectors 60 includes performing a plating process to form solder layers over UBMs 58, and then reflowing the solder layers. Throughout the description, the features over release film 32 are collectively referred to as reconstructed wafer 100.

Figure 13:
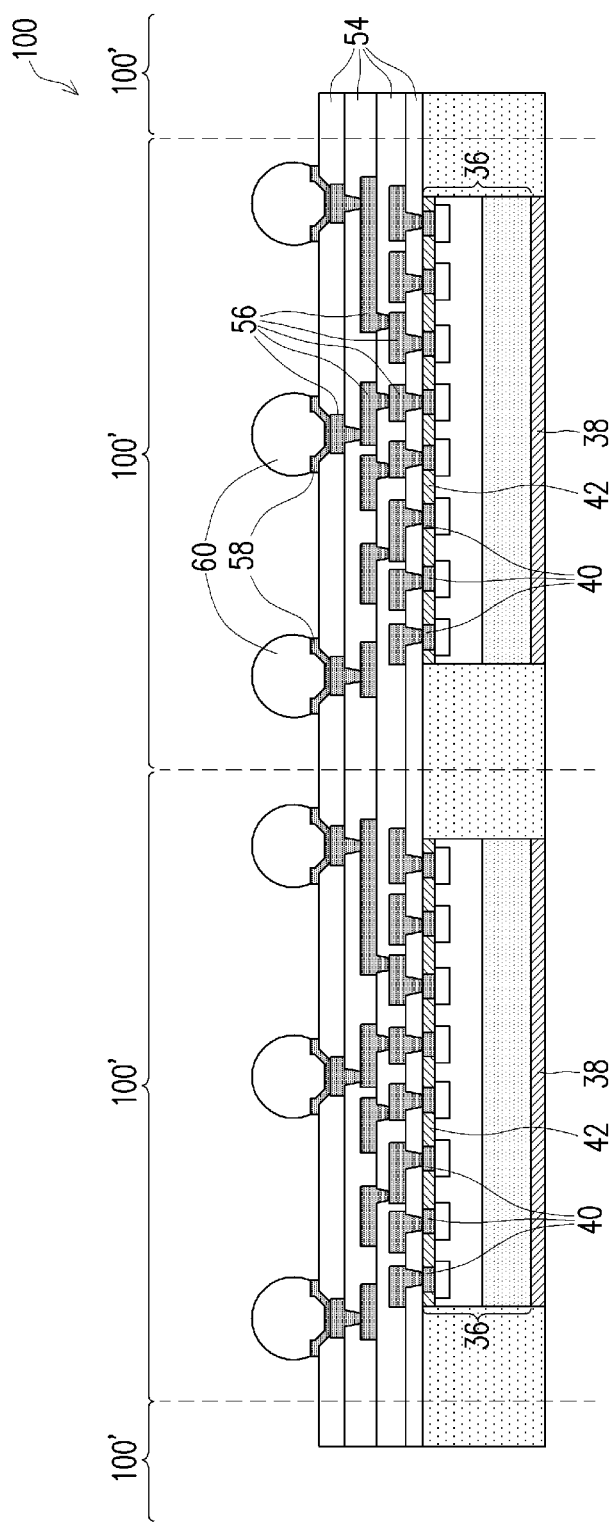

Next, the front side of reconstructed wafer 100 may be placed against a tape (not shown), which is attached to a frame (not shown). Next, a light beam (or another type of radiation source) is projected on release film 32, and the light beam penetrates through the transparent carrier 20'. In accordance with some embodiments of the present disclosure, the light beam is a laser beam, which may be scanned back and forth on release film 32, with each scanning being performed on an un-scanned portion of the release film 32. As a result of the light-exposure (such as the laser scanning), release film 32 is decomposed, and carrier 20' may be lifted off from release film 32, and hence composite wafer 100 is de-bonded (demounted) from carrier 20'. Reconstructed wafer 100 may then be singulated to form packages 100', as shown in FIG. 13. The respective process is also illustrated as process 220 in the process flow 200 as shown in FIG. 16.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By adopting an anisotropic carrier in a fan-out package formation process, the anisotropic warpage in the package formed over the anisotropic carrier may be compensated for by the anisotropic carrier. Accordingly, the warpage resulted from the fan-out structure is at least partially corrected. The anisotropic carrier may be formed by replacing parts of an isotropic carrier with elongated strips.

In accordance with some embodiments of the present disclosure, a method includes coating a release film over a carrier, wherein the carrier comprises a first material having a first CTE; and a second material having a second CTE different from the first CTE; placing a device die over the release film; encapsulating the device die in an encapsulant; and planarizing the encapsulant until the device die is revealed. In an embodiment, the device die has an elongated plane-view shape, with a ratio of a length to a width of the device die being greater than about 1.5, and after the encapsulant is planarized, a composite structure comprising the carrier, the release film, the device die and the encapsulant has concentric and round warpage contour lines. In an embodiment, the method further comprises de-bonding the device die and the encapsulant from the carrier. In an embodiment, the device die has an elongated plane-view shape having a first lengthwise direction. In an embodiment, the second material comprises a plurality of elongated strips, wherein the second CTE is smaller than the first CTE, and each of the elongated strips has a second lengthwise direction parallel to the first lengthwise direction. In an embodiment, the second material comprises a plurality of elongated strips, wherein the second CTE is greater than the first CTE, and each of the elongated strips has a second lengthwise direction perpendicular to the first lengthwise direction. In an embodiment, the release film is in physical contact with both of the first material and the second material. In an embodiment, the second material extends from a top surface of the first material to an intermediate level between the top surface and a bottom surface of the first material. In an embodiment, the second material comprises a plurality of elongated strip portions, each extending continuously from a first end of the carrier to a second end of the carrier, with the first end and the second end being opposing ends of the carrier.

In accordance with some embodiments of the present disclosure, a method includes coating a release film over a carrier, wherein the carrier has a top surface, and the carrier has a first CTE in a first direction parallel to the top surface; and a second CTE in a second direction parallel to the top surface, with the second direction being perpendicular to the first direction, wherein the second CTE is different from the first CTE; placing a plurality of device dies over the release film, wherein the plurality of device dies are spaced apart from each other, and the plurality of device dies are elongated device dies; encapsulating the plurality of device dies in an encapsulant; planarizing the encapsulant until the plurality of device dies are revealed; forming a redistribution structure over the plurality of device dies and the encapsulant, wherein the redistribution structure comprises a plurality of dielectric layers; and a plurality of redistribution lines in the plurality of dielectric layers, wherein the plurality of redistribution lines are in the plurality of dielectric layers; and de-bonding the plurality of device dies, the encapsulant, and the redistribution structure from the carrier. In an embodiment, the first CTE is greater than the second CTE, and the plurality of device dies are placed with lengthwise directions of the plurality of device dies being parallel to the second direction. In an embodiment, the carrier comprises a first material; and a second material different from the first material, wherein the second material extends into the first material. In an embodiment, the method further comprises forming the carrier, and the forming the carrier comprising forming trenches extending into an initial carrier, wherein the initial carrier comprises a first transparent material; filling the trenches with a second transparent material; and polishing the second transparent material until the first transparent material is revealed, wherein remaining portions of the first transparent material and the second transparent material form the carrier. In an embodiment, the trenches have depths smaller than a thickness of the carrier, and each of the trenches continuously extends from a first end of the carrier to a second end of the carrier. In an embodiment, the trenches are arranged as a plurality of columns, with each of the plurality of columns comprising a plurality of trenches. In an embodiment, a composite structure comprising the plurality of device dies and the encapsulant in combination have a third CTE and a fourth CTE, with the first CTE and the third CTE being measured in a same first direction, and the second CTE and the fourth CTE being measured in a same second direction perpendicular to the same first direction, and wherein the first CTE is greater than the second CTE, and the third CTE is greater than the fourth CTE.

In accordance with some embodiments of the present disclosure, a method includes coating a release film over a carrier, wherein the carrier comprises a first material; and a second material in the first material, wherein the second material is different from the first material, and wherein the second material comprises a plurality of elongated strips having a first lengthwise direction; placing a device die over the release film, wherein the device die is elongated and has a second lengthwise direction either parallel to or perpendicular to the first lengthwise direction; encapsulating the device die in an encapsulant; and planarizing the encapsulant until the device die is revealed. In an embodiment, the second lengthwise direction is parallel to the first lengthwise direction. In an embodiment, the second lengthwise direction is perpendicular to the first lengthwise direction. In an embodiment, the first material has a first thickness greater than a second thickness of the second material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
 placing a device die over a carrier, wherein the carrier comprises:
  a first material; and
  a second material different from the first material, wherein the second material comprises a plurality of elongated portions separated from each other by the first material, and wherein the plurality of elongated portions are elongated in a top view of the carrier;
 encapsulating the device die in an encapsulant;
 planarizing the encapsulant until the device die is revealed; and
 de-bonding the device die and the encapsulant from the carrier.

2. The method of claim 1, wherein the device die has an elongated plane-view shape.

3. The method of claim 1, wherein one of the plurality of elongated portions of the second material extends to opposite edges of the carrier.

4. The method of claim 1, wherein one of the plurality of elongated portions of the second material is fully encircled by the first material.

5. The method of claim 1, wherein in the top view of the carrier, the device die is elongated and has a lengthwise direction parallel to a lengthwise direction of the plurality of elongated portions of the second material.

6. The method of claim 1 further comprising forming a release film over and in physical contact with both of the first material and the second material, wherein the device die is placed over the release film.

7. The method of claim 1, wherein the second material is transparent.

8. The method of claim 1, wherein the second material penetrates through the first material.

9. The method of claim 1, wherein the second material form repeated patterns that expand throughout the carrier.

10. A method comprising:
 coating a release film over a carrier, wherein the carrier comprises:
  a first material extending from a top surface to a bottom surface of the carrier; and
  a plurality of strips in the first material, wherein the plurality of strips are formed of a second material different from the first material, and wherein the plurality of strips extend from the top surface of the carrier to an intermediate level between the top surface and the bottom surface of the carrier; and
 placing a plurality of device dies over the release film, wherein the plurality of device dies are spaced apart from each other, and the plurality of device dies are elongated device dies.

11. The method of claim 10, wherein each of the plurality of strips is encircled by the first material.

12. The method of claim 11, wherein the plurality of strips have elongated top-view shapes.

13. The method of claim 10, wherein both of the plurality of device dies and the plurality of strips have elongated top-view shapes, with first lengthwise directions of the plurality of device dies being parallel to second lengthwise directions of the plurality of strips.

14. The method of claim 10 further comprising forming the carrier, wherein the forming the carrier comprises:
 forming trenches extending into an initial carrier formed of the first material; and
 filling the trenches with the second material.

15. The method of claim 14 further comprising polishing the second material until both of the first material and the second material are exposed.

16. The method of claim 10, wherein the carrier has:
 a first Coefficient of Thermal Expansion (CTE) in a first direction parallel to the top surface; and
 a second CTE in a second direction parallel to the top surface, wherein the second direction is perpendicular to the first direction, wherein the second CTE is different from the first CTE, and wherein a composite structure comprising the plurality of device dies and a molding compound molding the plurality of device dies has:
 a third CTE and a fourth CTE, with the third CTE being measured in the first direction, and the fourth CTE being measured in the second direction, and wherein the first CTE is greater than the second CTE, and the third CTE is greater than the fourth CTE.

17. A method comprising:
- providing a carrier, wherein the carrier has a first warpage changing rate in a first direction, and a second warpage changing rate in a second direction perpendicular to the first direction, and wherein the second warpage changing rate is different from the first warpage changing rate;
- coating a release film over the carrier;
- placing a plurality of elongated device dies over the release film;
- encapsulating the plurality of elongated device dies in an encapsulant; and
- planarizing the encapsulant until the plurality of elongated device dies are revealed.

18. The method of claim 17, wherein the carrier comprises:
- a base material; and
- a plurality of elongated strips separated from each other by the base material, wherein the plurality of elongated strips are formed of a second material different from the base material.

19. The method of claim 18, wherein both of the base material and the plurality of elongated strips are transparent.

20. The method of claim 17, wherein before the plurality of elongated device dies are placed, the carrier has a first warpage pattern, and after the plurality of elongated device dies are placed and encapsulated, the carrier has a second warpage pattern, and wherein the second warpage pattern is more concentric then the first warpage pattern.

* * * * *